(12) United States Patent
Franchino et al.

(10) Patent No.: US 12,063,001 B2
(45) Date of Patent: Aug. 13, 2024

(54) VARIABLE SPEED DRIVE

(71) Applicant: Schneider Electric Industries SAS, Rueil Malmaison (FR)

(72) Inventors: Roger Franchino, Meylan (FR); Pierre-Yves Boyer, Saint Egrève (FR); Alain Dentella, Beaucroissant (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 154 days.

(21) Appl. No.: 17/940,349

(22) Filed: Sep. 8, 2022

(65) Prior Publication Data

US 2023/0080915 A1 Mar. 16, 2023

(30) Foreign Application Priority Data

Sep. 14, 2021 (EP) .................................... 21306264

(51) Int. Cl.
*H02P 23/14* (2006.01)
*H02P 27/08* (2006.01)
*H03K 3/037* (2006.01)
*H03K 17/567* (2006.01)

(52) U.S. Cl.
CPC .............. *H02P 23/14* (2013.01); *H02P 27/08* (2013.01); *H03K 3/037* (2013.01); *H03K 17/567* (2013.01)

(58) Field of Classification Search
CPC .............. H02M 1/32; H02M 7/53873; H02M 7/53871; H02M 1/327; H02M 1/08; H02P 27/08; H02P 23/14; H02P 6/085; H02P 27/085; H03K 3/037; H03K 17/567
See application file for complete search history.

(56) References Cited

U.S. PATENT DOCUMENTS

| 11,664,740 | B2* | 5/2023 | Ramanjani ........... H02H 7/1222 361/31 |
| 2018/0281600 | A1 | 10/2018 | Zhou et al. |
| 2022/0334152 | A1* | 10/2022 | Yamaguchi ............. H02M 1/32 |

OTHER PUBLICATIONS

Eleffendi, Mohd. Amir et al., "Evaluation of On-state Voltage V CE(ON) and Threshold Voltage Vth for Real-time Health Monitoring of IGBT Power Modules", 2015 17th European Conference on Power Electronics and Applications, Sep. 8, 2015, 10 pages.
Eleffendi, Mohd. Amir et al., "Application of Kalman Filter to Estimate Junction Temperature in IGBT Power Modules", IEEE Transactions on Power Electronics, vol. 31, No. 2, Feb. 1, 2016, pp. 1576-1587.
Ghimire, Pramod et al., "A review on real time physical measurement techniques and their attempt to predict wear-put status of IGBT", 2013 15th European Conference on Power Electronics and Applications, IEEE, Sep. 2, 2013, 10 pages.
Extended European Search Report dated Feb. 15, 2022 for European Patent Application No. EP21306264.9, 9 pages.

* cited by examiner

*Primary Examiner* — Said Bouziane
(74) *Attorney, Agent, or Firm* — Locke Lord LLP

(57) ABSTRACT

Examples include a variable speed drive and method for controlling such variable speed drive driving an electric motor. The variable speed drive includes an inverter and is able to detect when a specific component (IGBT or freewheeling diode) of a specific switch of the inverter crosses a predetermined voltage threshold. An example method allows determining a state of a specific component based on the detection of the crossing.

15 Claims, 8 Drawing Sheets

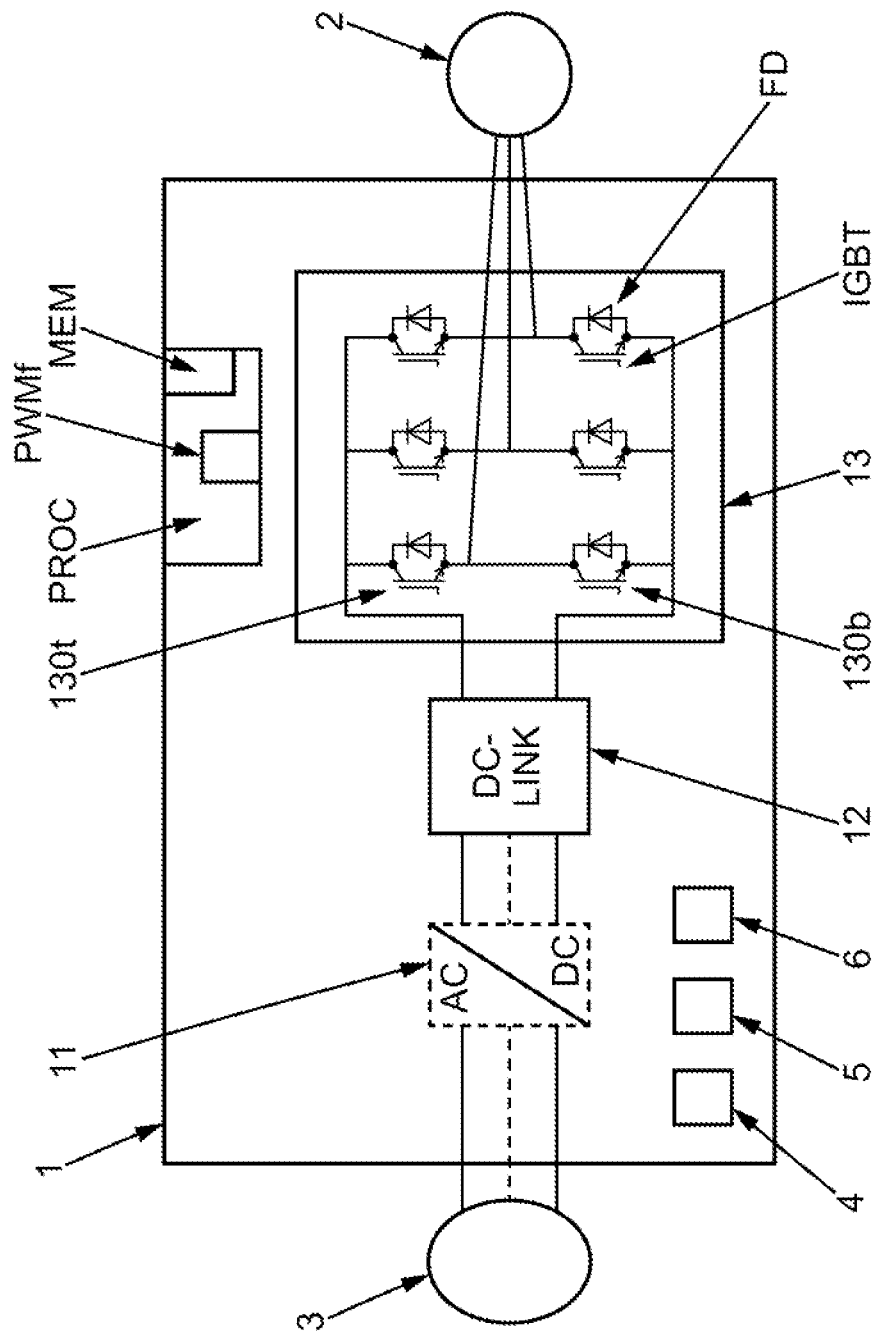

VARIABLE SPEED DRIVE

FIELD OF THE INVENTION

This invention relates to a variable speed drive and to a method for monitoring a state of a component of the variable speed drive.

BACKGROUND

Numerous three-phase electric motors connected to an electric network are driven by a variable speed drive. A variable speed drive allows modifying a frequency, amplitude and/or phase of an electric signal provided by an electric network in order to control an electric motor.

A variable speed drive driving a three-phase electric motor comprises six switches controlled using a pulse width modulation, PWM, function. Components of the switches may fatigue, and may lead to failures of the switch and to deterioration of the control of the electric motor.

The present invention aims at mitigating these issues.

SUMMARY

An object of the present disclosure is therefore to propose a variable speed drive for driving a three-phase electric motor, the variable speed drive comprising an inverter, a DC-link adapted to supply the inverter with a significantly continuous voltage, an interrupt controller, a conditioning stage, a hardware threshold detector unit, a flip-flop unit and an interrupt enable unit, whereby:
- the inverter comprises three legs connected to the three phases of the electric motor,
- each leg being connected on one side to a positive bus of the significantly continuous voltage and on another side to a negative bus of said significantly continuous voltage, each leg comprising a top switch and a bottom switch; whereby
- each switch comprises two components, a first component being an Insulated Gate Bipolar Transistor, IGBT, controlled by a PWM controller and a second component being a freewheeling diode, FD, connected in parallel with the IGBT;
- the conditioning stage comprises an input resistance connected to a collector of a specific switch of the inverter and an operational amplifier, OPA, connected to the input resistance;
- whereby the conditioning stage is adapted to clamp an input voltage of the OPA at an OPA power supply voltage;
- the hardware threshold detector unit is connected to an output of the OPA of the conditioning stage, the threshold detector unit comprising a specific comparator;
- whereby the specific comparator is adapted to compare a voltage across a specific component of the components of the specific switch to a predetermined voltage threshold associated to the specific component, and the specific comparator is adapted to transmit a logical edge to a specific synchronous flip-flop of the flip-flop unit based on the comparison;
- whereby the specific synchronous flip-flop is adapted to receive an interrupt enable signal from the interrupt enable unit, and the specific synchronous flip-flop is adapted to transmit a high logic level to an interrupt port of the interrupt controller at reception of the logical edge based on a logic level of the interrupt enable signal; and
- the logic level of the interrupt enable signal is determined based on commutation information of switches.

The variable speed drive comprising the characteristics above allows detecting when a voltage is crossing a predetermined voltage threshold across a specific component (freewheeling diode or IGBT) of a switch of the variable speed drive. The detection of the crossing is technically complex considering that when the specific component is "off", the specific component supports high voltage while when such specific component is "on", the specific component supports low voltage. Hence, electronic components allowing the detection of the crossing should be adapted to work at low and high voltage with precision while being protected against large and fast voltage fluctuations. Such crossing of a predetermined voltage threshold may be used for monitoring a state of the specific component based on dedicated parameters, for example based on a junction temperature of the specific component or a current in the phase of the electric motor connected to the leg of the specific component.

The variable speed drive comprising the characteristics above also allows considering voltage perturbations induced by commutations of the switches in the detection of the crossing of the predetermined voltage threshold. Indeed, voltage perturbations may lead the voltage across the specific component to undesirable crossing of the predetermined voltage threshold. In particular, a dedicated parameter of the specific component may be determined when such component is associated to a dedicated voltage with little or no external voltage disturbances due to commutations of switches, for example to be compared to a reference parameter in order to determine a state of the specific component.

Optionally, commutation information of switches comprises a component passing state of the specific component and periods of time following commutations of IGBT components. Such option allows enabling an interrupt protocol during an on state of the specific component, during a period of time whereby the voltage across the specific component has reduced or negligible voltage disturbances induced by commutations and whereby the voltage to be compared should be stabilized.

Optionally, the specific synchronous flip-flop is adapted to transmit the high logic level to the interrupt port of the interrupt controller during a high logic level of the interrupt enable signal, and the high logic level of the interrupt enable signal is determined when:
- a component passing state of the specific component is "on",
- a period of time following a commutation of the specific switch is greater than a specific switch delay, and
- a period of time following a commutation of switches is greater than a switch delay.

This option allows transmitting an interrupt enable signal when voltage disturbances across the specific component due to commutation of switches are reduced or negligible. This also allow transmitting an interrupt enable signal when the voltage to be compared (at an output of the OPA) is stabilized. In particular, such option allows considering two distinct delays. A specific switch delay is linked to commutations of the specific switch associated to the specific component. Such specific switch delay may allow waiting that the voltage to be compared, following a capacitor load when the specific switch commutes, becomes more stable. A switch delay is linked to commutations of any of the switches and may allow waiting that voltage disturbances induced by commutation of the switches in the voltage across the specific component reduce or become negligible.

Optionally, the specific component of the specific switch is the IGBT of the specific switch, the specific comparator is an IGBT comparator associated to the IGBT of the specific switch, the specific synchronous flip-flop is an IGBT synchronous flip-flop associated to the IGBT of the specific switch and connected to an output of the IGBT comparator; the threshold detector unit comprises a FD comparator associated to the FD of the specific switch; and the flip-flop unit comprises a FD synchronous flip-flop associated to the FD of the specific switch, the FD synchronous flip-flop being connected to an output of the FD comparator and adapted to transmit a high logic level at reception of a logical edge of the FD comparator to the interrupt port of the interrupt controller based on a logic level of a dedicated interrupt enable signal. Such option allows detecting a crossing of a respective predetermined voltage threshold across both freewheeling diode and IGBT components of a specific switch. Such option also allows sharing between both components of the specific switch a common conditioning stage. Sharing a common conditioning stage allows avoiding a duplication of electronic components of the conditioning stage and therefore reducing a cost for detecting a crossing of a predetermined voltage, reducing a cost of maintenance operations and reducing a cost of component replacements.

Optionally, the flip-flop unit comprises an OR logic gate connected on one side to the FD and IGBT flip-flops and on another side to the interrupt port of the interrupt controller. The OR logic gate for example allows, for both components of the specific switch (freewheeling diode and IGBT), triggering a same interrupt protocol in order to determine a same dedicated parameter, for example a current in the same phase.

Optionally, each leg of the variable speed drive comprises a respective conditioning stage, a respective threshold detector unit and a respective flip-flop unit wherein each respective flip-flop unit associated to a respective leg is adapted to transmit a respective high logic level to a respective specific interrupt port of the interrupt controller at reception of a logical edge of its respective specific comparator. This allows monitoring a dedicated parameter associated to a phase of the electric motor based on a dedicated interrupt protocol of the interrupt controller.

Optionally, the variable speed drive comprises a respective conditioning stage, a respective threshold detector unit and a respective flip-flop unit for each switch. This allows determining respective dedicated parameters for each of the components of the switches of the electric motor at a crossing of a respective predetermined voltage threshold.

Optionally, the interrupt enable unit comprises timers associated to switches. This allows, for example, implementing the interrupt enable unit based on existing timers of the PWM controller which already comprises commutation information of the switches.

Optionally, a specific switch is associated to a specific switch timer and to another switch timer, the specific switch timer is adapted to start counting time at a first switching of the specific switch and is adapted to reset the counting at a second switching of the specific switch directly following the first switching of the specific switch, and the other switch timer is adapted to start counting time at a first switching of any switches and is adapted to reset the counting at a second switching of any switches directly following the first switching of any switches.

This option allows driving timers associated to the specific switch in order to transmit the interrupt enable signal to the specific flip-flop when the voltage perturbations across the specific component induced by commutation are reduced or negligible and when a voltage to be compared is stabilized.

Optionally, the interrupt enable unit comprises an AND logic gate connected on one side to the specific switch timer and to the other switch timer of a specific switch and on another side to the specific flip-flop. Such AND logic gate allows considering a difference between a time delay following a commutation associated to the specific switch and a time delay following a commutation associated to switches in the voltage perturbations induced by such commutations.

Optionally, the variable speed drive comprises current measuring means adapted to measure currents across phases of the electric motor. This allows measuring currents of a phase of the electric motor connected to the specific component, for example during an interrupt protocol implemented by the interrupt controller. Such current measurements may be used to determine a state of the specific component. Such measurements may for example be used with junction temperatures to determine that the specific component is submitted to wire bonding lift-off or to solder delamination.

Optionally, the variable speed drive comprises temperature measuring means adapted to measure junction temperatures of components of the switches. Junction temperatures of a specific switch may for example be used to determine a state of such specific component. Such measurements may for example be used with current measurements to determine that the specific component is submitted to wire bonding lift-off or to solder delamination.

Optionally, the variable speed drive comprises an alert unit. The alert unit may for example be adapted to trigger an alert based on a current measurements for a specific phase of the electric motor. The alert unit allows, for example, alerting an operator of a state of a specific component of a specific switch of the variable speed drive.

The disclosure also presents a method for monitoring a state of a component of a switch of a variable speed drive as presented in the different options above; the method comprising: delivering, by the interrupt enable unit, the interrupt enable signal, the logic level of the interrupt enable signal being determined based on commutation information of at least one of switches;

monitoring, by the specific comparator, a voltage across the specific component of the specific switch of a specific leg;

when the voltage across the specific component of the specific switch crosses a predetermined voltage associated to the specific component while the interrupt enable signal is at a predetermined logic level, measuring a current in a phase of the electric motor associated to the specific leg;

determining, based on the current measured, on a junction temperature of the specific component, and on the predetermined voltage threshold associated to the specific component, a state of the specific component; and triggering an alert.

The method therefore allows detecting a state of a specific component based on a current measured in a phase of the electric motor associated to the leg of the specific component and based on the junction temperature of the component. In particular, the method may allow detecting that the specific component is submitted to wire bonding lift-off or to solder delamination by measuring a current associated to the predetermined voltage threshold in real time.

Optionally, triggering an alert comprises at least one of sending an alert message, playing an alert song, and displaying an alert icon. Such types of alert allow, for example, making an operator aware of a potential issue at the variable speed drive, increase safety or preventing or reducing damage to the variable speed drive or to the electric motor. Such types of alert also allow, for example, making manufacturers aware of the variable speed drive health or of the specific component health for generating statistics in order to identify a default on a specific component or on a specific production line.

The present disclosure also describes a computer-readable storage medium comprising instructions which, when executed by at least one controller, cause the at least one controller to carry out the method of any one of the methods hereby described.

The present disclosure further discloses a computer program product comprising instructions which, when the program is executed by a computer, cause the computer to carry out any one of the methods hereby described.

BRIEF DESCRIPTION OF THE DRAWINGS

FIG. 1 illustrates an example of architecture comprising a variable speed drive for controlling an electric motor.

DETAILED DESCRIPTION

Figure 2A:
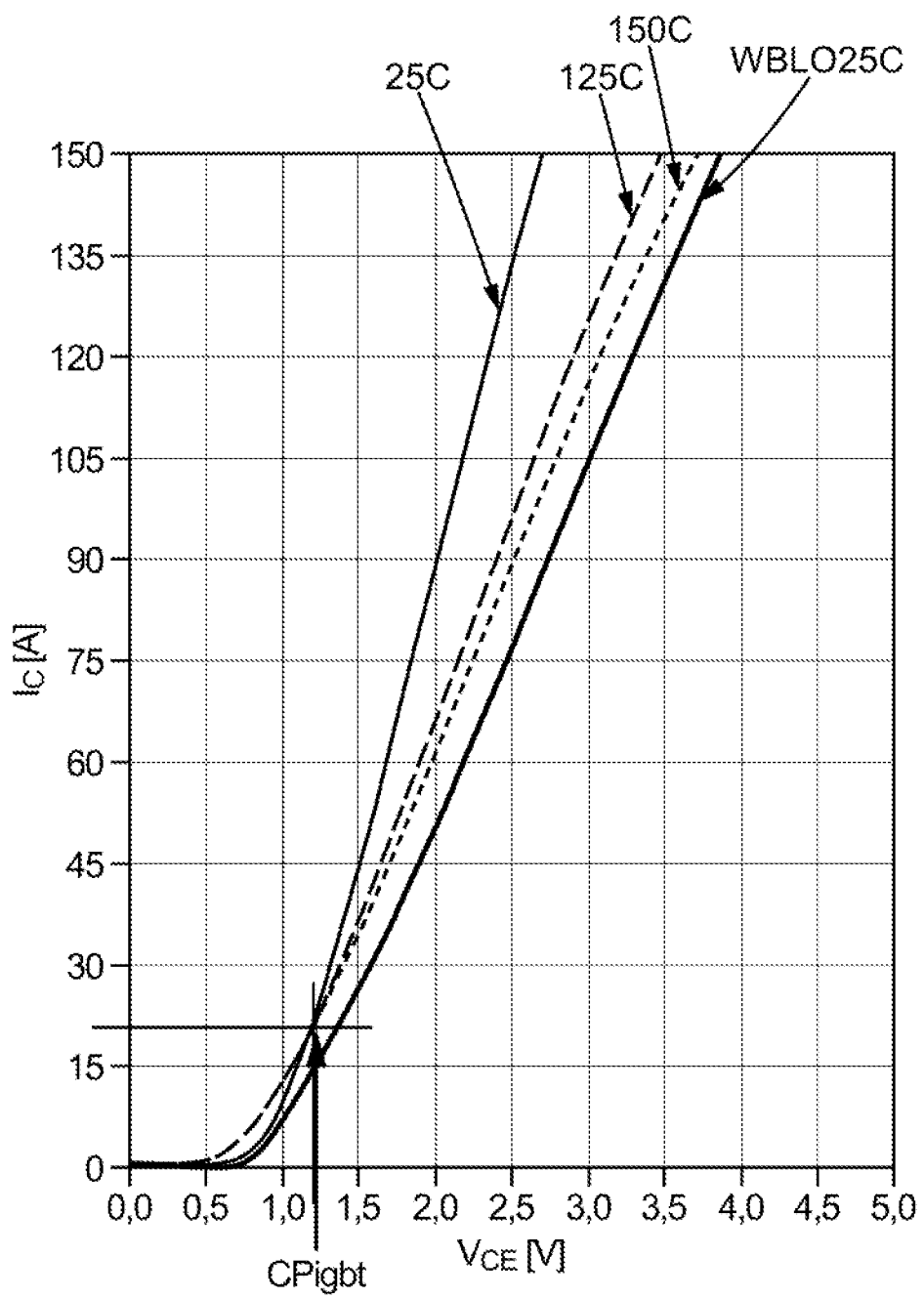
FIG. 2a illustrates an example evolution of a current (y-axis) flowing through an IGBT component of a switch depending on a voltage (x-axis) across the IGBT component and on a junction temperature associated to such IGBT component.

In reference to FIG. 1, a variable speed drive 1 for driving a three-phase electric motor 2 is represented. The variable speed drive 1 should be understood in this disclosure as a control unit for an electric motor implemented at least in part in hardware, for example electronically. The variable speed drive may also be partially implemented virtually or by software.

A three-phase electric motor 2 should be understood in this disclosure as any kind of electric motors which may be driven by a variable speed drive. The electric motor may be a motor controlled by an alternating voltage, for example an induction motor. In some examples, the electric motor may be a synchronous electric motor or an asynchronous electric motor.

The variable speed drive 1 comprises an inverter 13 and a direct power bus, DC-link 12, connected to the inverter 13. The DC-link 12 is adapted to supply the inverter with a significantly continuous voltage and comprises a positive bus and a negative bus. A significantly continuous voltage may be understood as a voltage with reduced fluctuations compared to an alternating voltage. Such alternating voltage may for example be provided by an electric power source 3. Fluctuation may for example be reduced by at least 70% and preferably reduced by at least 90% compared to the alternating power source provided by the electric power source 3.

The DC-link is therefore connected to an electric power source 3. The electric power source may for example correspond to an alternating power source. In some examples, the electric power source may correspond to a two-phase or a three-phase electric network. In some other examples, the power source 3 may for example correspond to a battery and may be a continuous power source.

In examples wherein the electric power 3 is an alternating power source, the variable speed drive also comprises a rectifier 11 intended to convert an alternating voltage supplied by the alternating power source into a direct voltage. In some examples, the rectifier may be a half-wave rectifier.

The inverter 13 is intended to cut off the direct voltage supplied by the DC-link into a variable voltage to control the three-phase electric motor 2. The inverter 13 comprises three legs respectively connected and associated to the three phases of the electric motor. Each leg is connected on one side to the positive bus of the DC-link and on another side to the negative bus of the DC-link.

The inverter also comprises, in this example, 6 switches 130. Each leg of the inverter comprises a top switch 130t and a bottom switch 130b. A connection between a leg and a phase of the electric motor is located between the top and the bottom switch as illustrated in FIG. 1. Top and bottom are used here to differentiate two switches in the illustrated example and may not necessarily imply that such switches are effectively in a top/bottom configuration.

Each switch comprises two components, a first component being an Insulated Gate Bipolar Transistor, IGBT, and a second component being a freewheeling diode, FD, connected in parallel with the IGBT.

The components (IGBT and FD) of the switches 130 may fatigue which may lead to a deterioration of the control of the electric motor. In particular, two mains defaults may occur on such components, a wire bounding lift-off and a solder delamination. The variable speed drives presented by the present disclosure allow, among others, determining that at least one of these defaults occurs on a specific component of a switch and more generally on several or even on each component of the specific switch.

In particular, it has been found out that the wire-bonding lift-off of a component leads to increasing an internal resistance of the component when such component is "on" (called ON internal resistance Ron hereinafter) compared to an end-of-line, or nominal, value of such internal resistance. The inventors have also found out that the solder delamination of a component can be determined based on a thermal resistance Rth of the specific component. An end-of-line, or nominal, value of a component corresponds to a value determined for a component at an end of a production line, i.e. when the component is significantly new.

Both thermal resistance Rth and ON internal resistance Ron of the component may be estimated at a given instant based on a current flowing through the component, a voltage across the component and a junction temperature of the component. Hence, a state of a component may be determined based on these parameters at a given instant.

In particular, the ON internal resistance Ron of a component corresponds to a voltage across the component (hereinafter called Vce for the IGBT and Vf for the FD) when such component in ON divided by the current (hereinafter called Ic) flowing through such component (Ron=Vce/Ic for the IGBT and Ron=Vf/Ic for the FD).

The thermal resistance Rth of a component corresponds to a difference between a temperature of the component (hereinafter called Tc) and an ambient temperature (hereinafter called Ta) divided by a multiplication of a voltage across the component with a current flowing through such component (Rth=(Tc−Ta)/(Vce×Ic) for the IGBT and Rth=(Tc−Ta)/(Vf×Ic) for the FD). The difference (Tc−Ta) between the temperature of the component Tc and the ambient temperature Ta corresponds to a junction temperature (called hereinafter Tj).

Examples of curves representing an evolution of a current Ic (y-axis) flowing through an IGBT component of a switch depending on a voltage Vce (x-axis) across the IGBT component and on a junction temperature Tj associated to such IGBT component are illustrated in FIG. 2a. A curve 25C corresponds to a curve of current when the junction temperature Tj associated to the IGBT component is determined at 25° C. A curve 125C corresponds to a curve of current when the junction temperature Tj associated to the IGBT component is determined at 125° C. A curve 150C corresponds to a curve of current when the junction temperature Tj associated to the IGBT component is determined at 150° C. A curve WBLO25C corresponds to a curve of current when the junction temperature Tj associated to the IGBT component is determined at 25° C. and when the IGBT component is submitted to wire bonding lift-off. The 25C, 125C and 150C curves are curves which may be generated based on measurements of end-of-line values.

As we can observe from the figure, the curve WBLO25C of current is shifted to the right compared to the curve 25C. Therefore, for a same voltage Vce across an IGBT component at a same junction temperature Tj, a current Ic flowing through the IGBT component submitted to wire bonding lift-off will be smaller than a current flowing through an IGBT component in end-of-line. In other words, for a same voltage and for a same junction temperature, an ON internal resistance Ron of an IGBT component submitted to wire bonding lift-off is greater than an ON internal resistance Ron of an IGBT component in end-of-line.

We can also observe from the different curves that the current Ic flowing through the IGBT component depends on a junction temperature of such component. In particular, when a voltage across the IGBT component is smaller than an IGBT voltage crossover point CPigbt (around 1.2V on the FIG. 1), for a same voltage Vce across the IGBT component, a higher junction temperature Tj corresponds to a higher current Ic flowing through the IGBT component. By contrast, when a voltage across the IGBT component is greater than the IGBT voltage crossover point CPigbt, for a same voltage Vce across the IGBT component, a higher junction temperature Tj corresponds to a smaller current Ic flowing through the IGBT component. The crossover point of a component corresponds to the voltage for which a current flowing through such component is independent of the junction temperature.

Hence, a thermal resistance Rth associated to an IGBT component submitted to solder delamination will be greater than a thermal resistance Rth associated to an IGBT component in end-of-line when the voltage across the IGBT component is smaller than the IGBT voltage crossover point CPigbt. By contrast, the thermal resistance Rth associated to the IGBT component submitted to solder delamination will be smaller than a thermal resistance Rth associated to an IGBT component in end-of-line when the voltage across the IGBT component is greater than the IGBT voltage crossover point CPigbt. This means that when the voltage across the IGBT component is smaller than the IGBT voltage crossover point CPigbt, a current Ic flowing through the IGBT component submitted to solder delamination will be greater than a current flowing through an IGBT component in end-of-line. This also means that when the voltage across the IGBT component is greater than the IGBT voltage crossover point CPigbt, a current Ic flowing through the IGBT component submitted to solder delamination will be smaller than a current flowing through an IGBT component in end-of-line.

We can therefore observe that:
for a same junction temperature of IGBT components, a current Ic flowing through an IGBT component submitted to wire bounding lift-off is smaller than a current flowing through an IGBT component of end-of-line regardless of a voltage across the IGBT component,
for a same voltage across IGBT components, a current flowing through an IGBT component submitted to solder delamination is greater than a current flowing through an IGBT component of end-of-line when such same voltage across the IGBT component is smaller than the IGBT voltage crossover point CPigbt, and
for a same voltage across IGBT components, a current flowing through an IGBT component submitted to solder delamination is lower than a current flowing through an IGBT component of end-of-line when such same voltage across the IGBT component is greater than the IGBT voltage crossover point CPigbt.

Figure 2B:
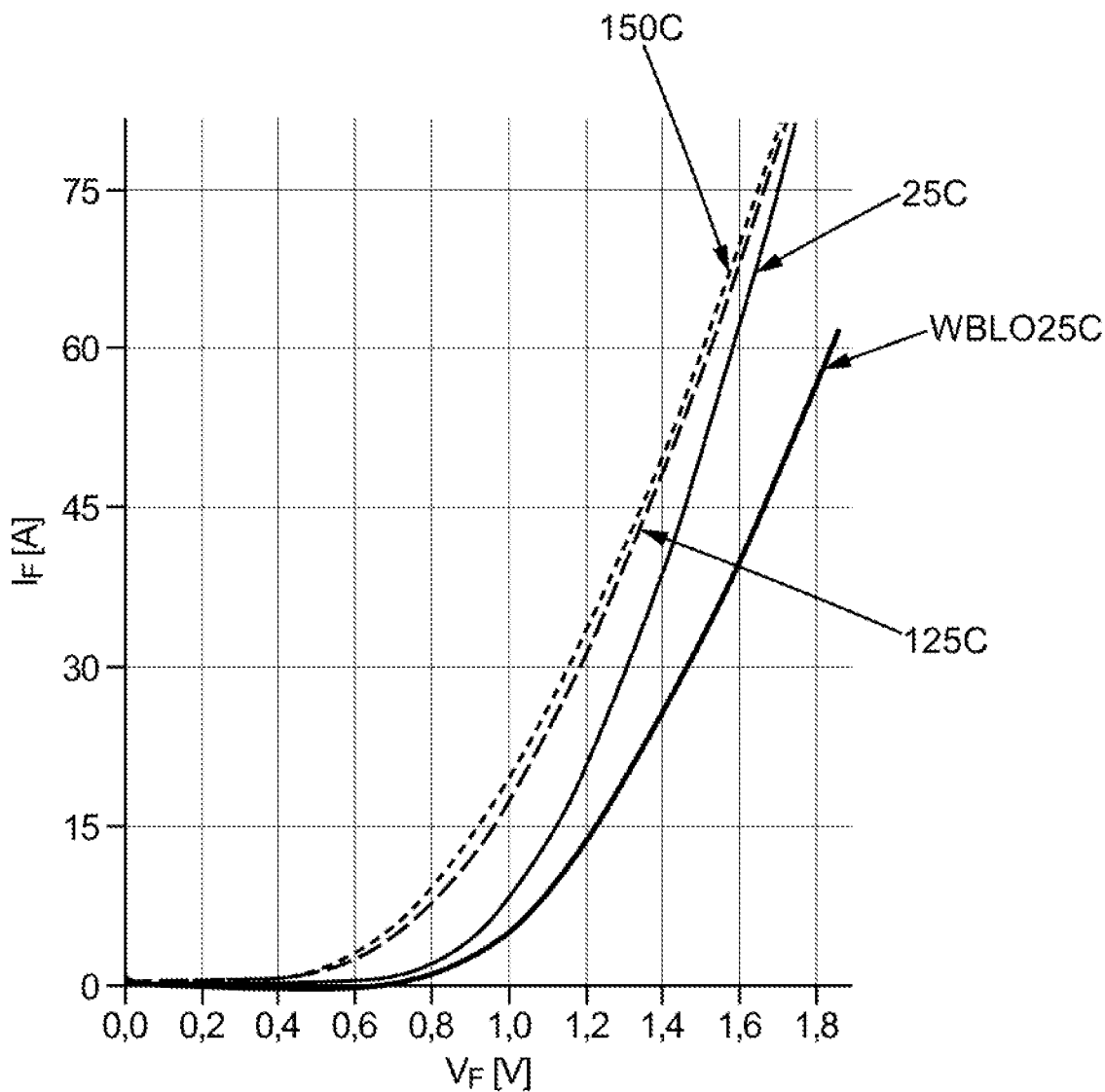
FIG. 2b illustrates an example evolution of a current (y-axis) flowing through an FD component of a switch depending on a voltage (x-axis) across the FD component and on a junction temperature associated to such FD component.

Examples of curves representing an evolution of a current Ic (y-axis) flowing through an FD component of a switch depending on a voltage Vf (x-axis) across the FD component and on a junction temperature Tj associated to such FD component are illustrated in FIG. 2b. The curves of FIG. 2b with the same reference of curves of FIG. 2a correspond to curves associated to equivalent characteristics.

Equivalent observations can be made for the FD component and for the IGBT component except that a FD voltage crossover point (not represented in the figure) is greater than the IGBT voltage crossover point.

We can therefore observe that:
for a same junction temperature of FD components, a current Ic flowing through an FD component submitted to wire bounding lift-off is smaller than a current flowing through an FD component of end-of-line regardless of a voltage across the FD component,
for a same voltage across FD components, a current flowing through an FD component submitted to solder delamination is greater than a current flowing through an FD component of end-of-line when the voltage across the IGBT component is smaller than the FD voltage crossover point, and
for a same voltage across FD components, a current flowing through an FD component submitted to solder delamination is lower than a current flowing through an FD component of end-of-line when the voltage across the IGBT component is greater than the FD voltage crossover point.

Hence, we are able to detect a state of a specific component based on a junction temperature of such component and based on a current flowing through such component at a given voltage.

The present disclosure therefore proposes to detect a specific value of a voltage across a specific component of a switch of a variable speed drive 1 in order to determine dedicated parameters associated to the specific value of the voltage in real time. In particular, the variable speed drive is adapted to detect when a voltage across a specific component of a specific switch crosses a predetermined voltage threshold when such specific component is "on".

In some examples, the dedicated parameters may correspond to a current flowing through the specific switch associated to the specific component and to a junction temperature of the specific component. The current and the junction temperature may be used to determine a state of a specific component. In particular, the current and the temperature evolve in real time and therefore, to acquire accurate values of current and temperature linked to the predetermined voltage threshold, the acquisition of such values should be implemented rapidly after the crossing of the predetermined voltage threshold.

The example variable speed drive 1 disclosed herein is therefore adapted to detect a voltage across a specific component (IGBT or FD) of a specific switch 130s crossing a predetermined voltage threshold when such specific component is "on", in real time.

The variable speed drive 1 comprises current measuring means 4 adapted to measure currents across phases of the electric motor 2. In some examples, current measuring means may comprise a shunt, a galvanometer or a Hall-effect current sensor.

The variable speed drive 1 comprises temperature measuring means 5 adapted to measure ambient temperatures Ta and components temperature Tc of the components of the switches. Such temperature measuring means 5 may for example comprise a thermistor, a thermocouple sensor or a resistance temperature detector (RTD).

The variable speed drive 1 comprises an alert unit 6 adapted to trigger an alert. Such alert may be triggered based on current measurements measured by the current measuring means. The alert unit 6 may for example be adapted to trigger an alert based on a current measured for a specific phase of the electric motor. In some examples, the alert unit 6 may be adapted to send an alert message, to play an alert song or to display an alert icon.

In some examples, the variable speed drive comprises a processing and control unit intended to implement a control law by taking into account, for example, an input speed set point, to be applied to the electric motor during normal operation of the motor and control instructions to be applied to an inverter stage in order to obtain these output voltages. The control law may be of a vector or a scalar type.

The variable speed drive comprises a PWM controller, for example a processor PROC or a microcontroller. The PWM controller comprise a PWM function PWMf controlling the IGBT components of the switches to apply the conversion from the direct voltage provided by the DC-bus to the controlled alternating voltage. The PWM controller may comprise electronic circuits for computation managed by an operating system. In some examples, the PWM controller corresponds to a digital signal processor, DSP, or to a digital signal controller DSC.

In some examples, the PWM controller may be configured to operate, at least in part, a method for monitoring a state of a component of a switch of the variable speed drive presented below in reference to FIG. 5.

The variable speed drive 1 may comprise a non-transitory machine-readable or computer readable storage medium, such as, for example, memory or storage unit MEM, whereby the non-transitory machine-readable storage medium is encoded with instructions executable by a controller such as the PWM controller. The machine-readable storage medium may comprise instructions to operate a PWM controller or another controller to implement a method for monitoring a state of a component of a switch. A computer readable storage according to this disclosure may be any electronic, magnetic, optical or other physical storage device that stores executable instructions. The computer readable storage may be, for example, Random Access Memory (RAM), an Electrically Erasable Programmable Read Only Memory (EEPROM), a storage drive, and optical disk, and the like. As described hereby, the computer readable storage may be encoded with executable instructions according to operate a method for monitoring a state of a component of a switch of the variable speed drive. Storage or memory may include any electronic, magnetic, optical or other physical storage device that stores executable instructions as described hereby.

Figure 3:
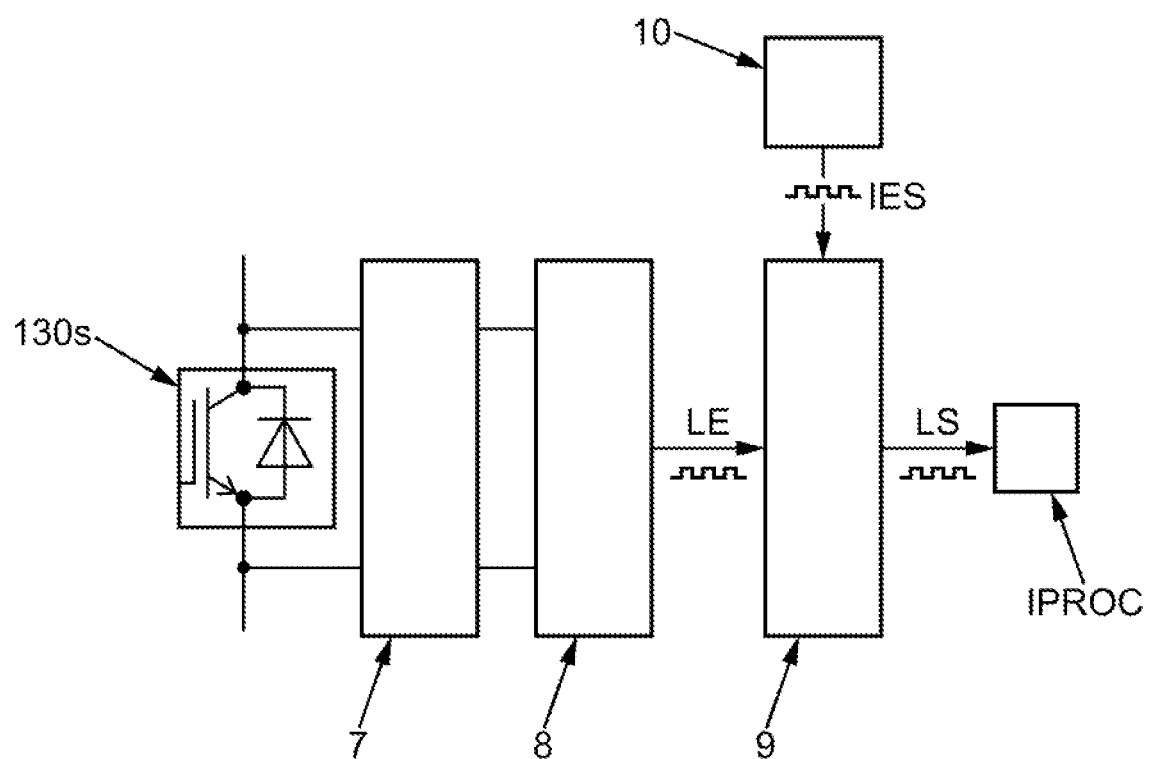
FIG. 3 illustrates an example of architecture allowing a variable speed drive to detect when a voltage across a specific component crosses a predetermined voltage threshold.
Figure 4A:
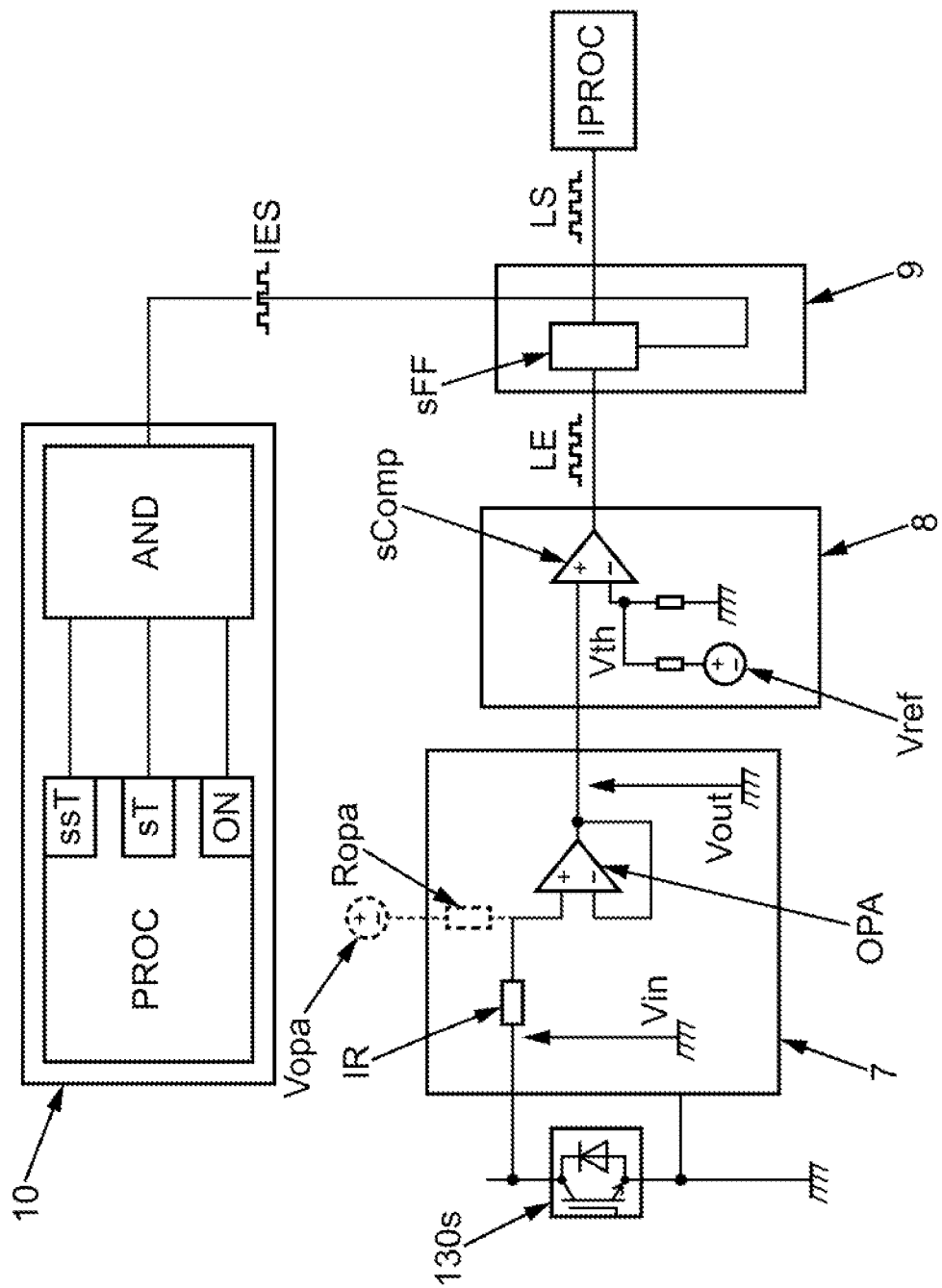
FIG. 4a illustrates a first example of circuit allowing a variable speed drive to detect when a voltage across a specific component crosses a predetermined voltage threshold.

In reference to FIGS. 3 and 4a is described below an example of circuit allowing a variable speed drive 1 to detect when a voltage Vin across a specific component crosses a predetermined voltage threshold. Some examples of circuit, for example examples of circuit illustrated in FIGS. 4b and 4c, also allow detecting when a voltage across both components (IGBT and FD) of a specific switch 130s crosses a respective predetermined voltage threshold (which may be different for the IGBT and for the FD). It should be noted that the examples of circuit presented below for one switch can be duplicated for other switches and preferably for each of the six switches of the variable speed drive 1.

As previously mentioned, one of the objectives of the examples of variable speed drive described here consists of detecting when a voltage across a specific component crosses a predetermined voltage threshold. The detection of the predetermined voltage threshold therefore provides a known indication of a parameter of the specific component at a given instant of time during operation of the variable speed drive. Such known indication can be related to other parameters in order to acquire information about a system at the given instant. As explained above, in an application, the known indication (the voltage across the specific component at a given instant) may be related to a current and a junction temperature of the specific switch in a purpose of determining a state of such specific switch.

However, it should be noted that the voltage across the specific component evolves during the time such as other parameters, for example as the current flowing through the specific component and the junction temperature of such specific component. Therefore, in order to access to the known indication at the given instant before that the voltage across the component evolves significantly, the detection of the crossing of the predetermined voltage threshold may be done in real time using electronic or electrical components. Hence, examples of circuit presented above are at least partially hardware to detect the crossing of the predetermined threshold in real time.

Such real time detection may also allow trigger some parameter determinations, for example using an interrupt protocol, to determine the parameters related to the predetermined voltage threshold in a reduced time beginning from such detection, i.e. during a time whereby the value of such parameters have not evolved significantly compared to their respective value at the given instant of crossing. Hence, a difference between a value of a parameter at the given instant of crossing and at the instant wherein such parameter is effectively acquired, may be neglected or compensated.

In particular, using the detection of the predetermined voltage threshold to trigger a determination of a current flowing through the specific component and to determine a junction temperature of such the specific component allows determining a state of the specific component at the instant of crossing.

However, it should be noted that the detection of the predetermined voltage threshold may be used to trigger a determination of other parameters in order to acquire information about the variable speed drive or to acquire information about a larger system comprising the variable speed drive instead of information about the specific component.

The example circuits of the variable speed drive presented below therefore allows acquiring a value of parameters at a given instant wherein the voltage across the specific components crosses the predetermined voltage threshold thereby obtaining an estimated picture of a system at such given instant.

As illustrated in FIG. 3, the variable speed drive 1 comprises a circuit comprising a conditioning stage 7, a hardware threshold detector unit 8, a flip-flop unit 9, an interrupt enable unit 10 and an interrupt controller IPROC.

The conditioning stage 7 is connected on one side to the specific switch 130 and on another side to the hardware threshold detector unit 8. The hardware threshold detector unit 8 is connected on one side to the conditioning stage 7 and on another side to the flip-flop unit 9. The flip-flop unit 9 is connected on one side to the hardware threshold detector unit 8 and on another side to the interrupt controller IPROC.

The conditioning stage 7 is an electronic or electrical stage for restricting a current and a voltage to acceptable values to be treated by further electronic or electrical elements of the circuit as the hardware threshold detector unit 8. Indeed, and as said above, a voltage across the specific component alternates between low voltage, for example between 0 and ±3V when such specific component is "on", to high voltage, for example ±several hundreds of volts, when such specific component is "off". Moreover, the fluctuation between low and high voltage across a component of a specific switch are fast following the commutation frequency of the IGBT component. In some examples, a commutation frequency of the IGBT component may be greater than 1 kHz and may be comprised between 2 and 16 kHZ. Hence, a current and a voltage across the components of the different elements of the circuit can be clamped to prevent components from electric damages.

The conditioning stage 7 therefore comprises an input resistance IR connected to a collector of the specific switch 130. The input resistance IR is adapted to limit a current flowing through the circuit. A value of the input resistance IR may be determined based on a maximum current flowing through the collector of the specific switch. A value of the input resistance IR may therefore be determined based on characteristics of the electric power source 3.

The conditioning stage 7 also comprises an operational amplifier, OPA, connected to the input resistance IR. The OPA is adapted to clamp the voltage Vin across the specific component at an OPA power supply (not represented), for example using its internal diode (not shown). Using the internal diode of the OPA allows precisely measuring electric values by avoiding leakage current and temperature deviation. The OPA therefore protects electronic elements of the circuit from high voltage when the specific component is "off".

Figure 4B:
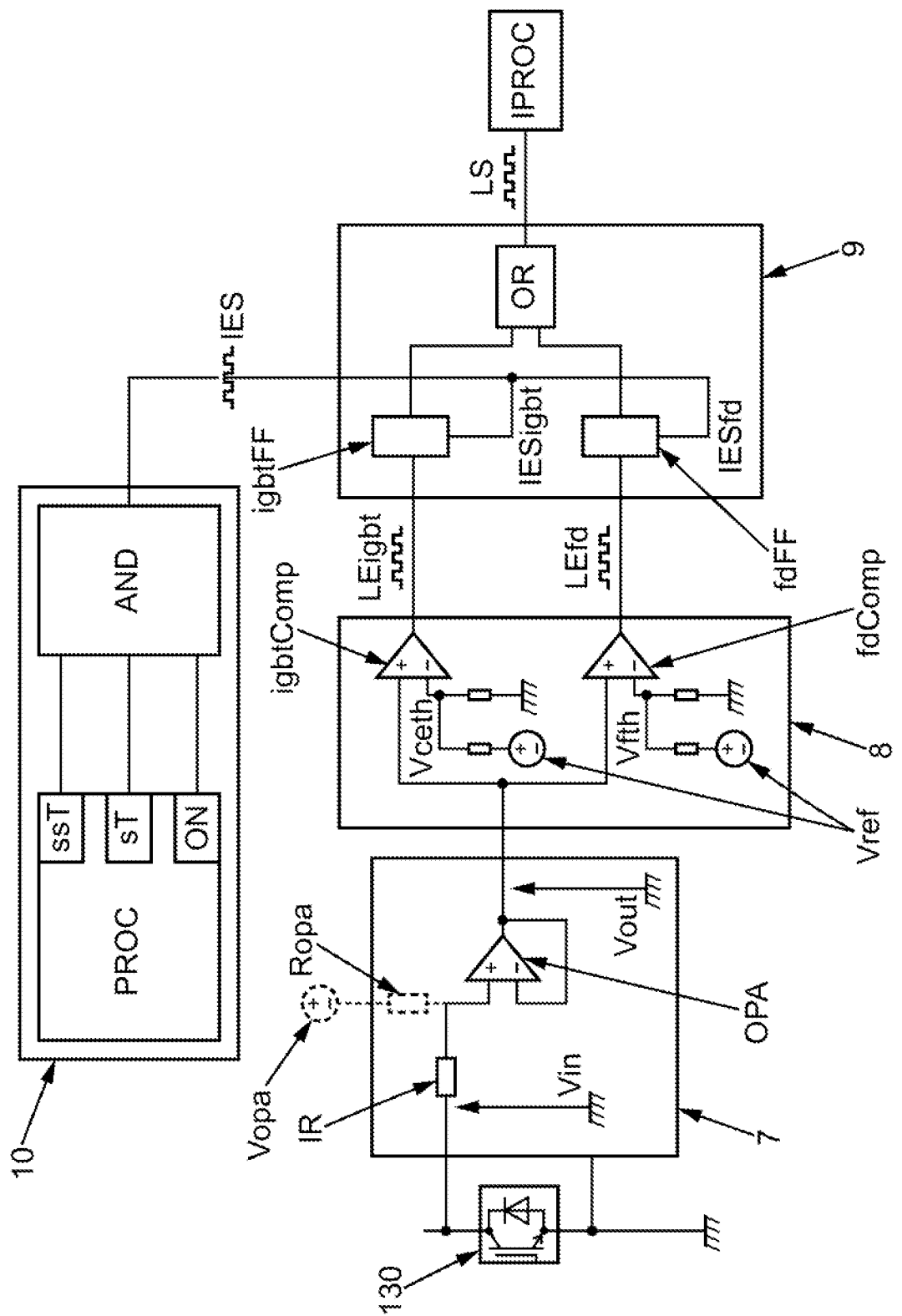
FIG. 4b illustrates a second example of circuit allowing a variable speed drive to detect when a voltage across a specific component crosses a predetermined voltage threshold.
Figure 4C:
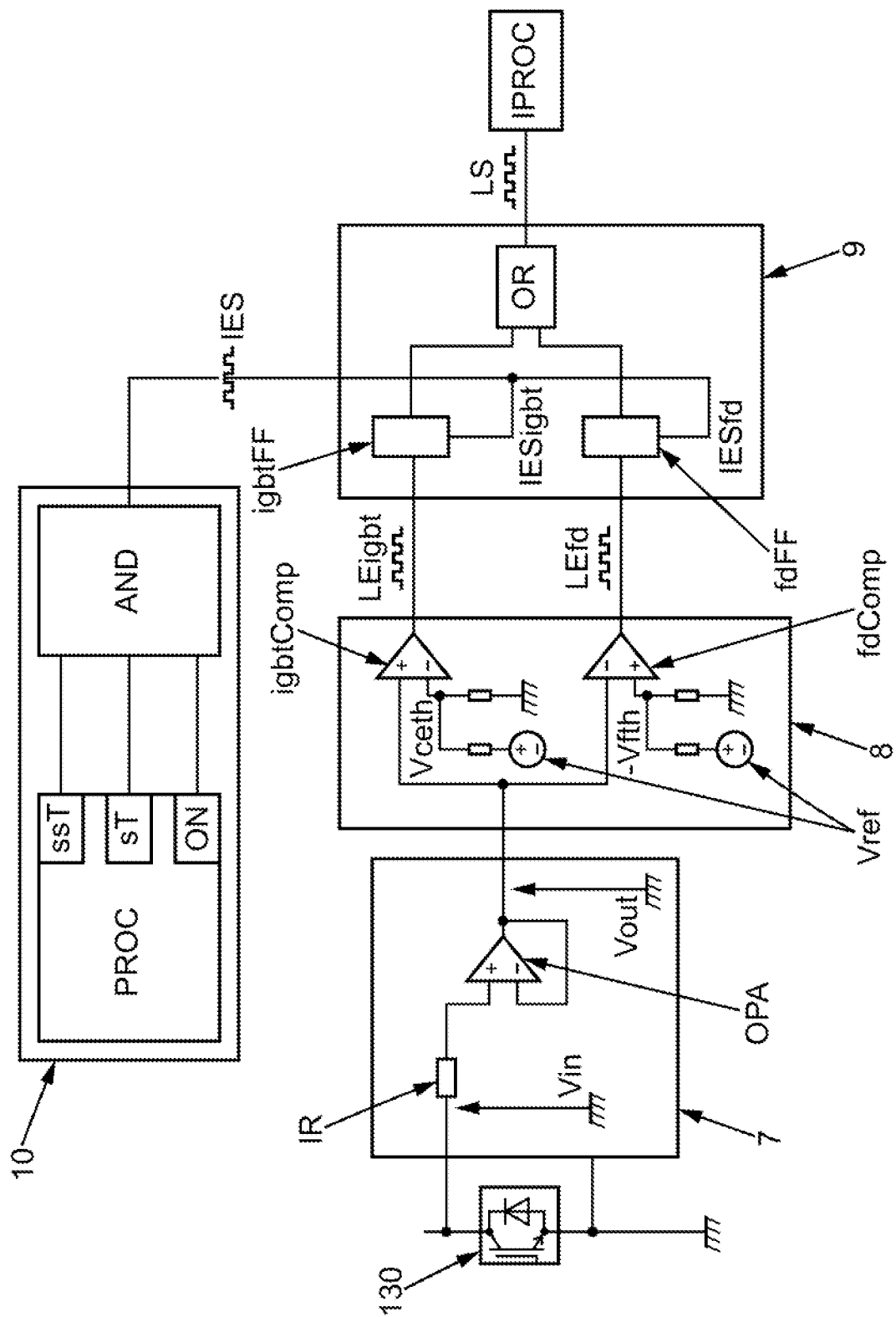
FIG. 4c illustrates a third example of circuit allowing a variable speed drive to detect when a voltage across a specific component crosses a predetermined voltage threshold.

As illustrated by the FIGS. 4a, 4b and 4c, the OPA comprises an output voltage Vout corresponding to a voltage between an output of the OPA and the ground. The OPA comprises a feedback loop between the output of the OPA and a negative input of the OPA. The OPA comprises two power pins (not represented), at least one of them being connected to a power supply of the OPA.

The OPA power supply may be unipolar or bipolar. An example of a circuit comprising an OPA supplied by unipolar power supply is illustrated in FIG. 4b. An example of a circuit comprising an OPA supplied by bipolar power supply is illustrated in FIG. 4c.

The voltage of the OPA power supply is chosen to protect the circuit against high voltage when the specific component is "off" and to avoid a voltage saturation when such component is "on". Indeed, as said above, one of the objectives of the present disclosure is to detect when a voltage Vin across a specific component of the variable speed drive (when such specific component is "on"), crosses a predetermined voltage threshold. Hence, if a power supplied to the OPA is weaker than voltage Vin across the specific component, such input voltage Vin will be clamped to fit with the OPA power supply and information of the voltage Vin across the specific component will be lost at least in part.

In some examples, the OPA is unipolar and a power supply is connected to a power pin of the OPA. In such example, the power supply provides at least 2V and preferably at least 5V to the power pin. In some other examples, the OPA is bipolar and a first power supply provides at least 2V and preferably at least 5V to a positive power pin while a second power supply provides less than −2V and preferably less than −5V to a negative power pin of the OPA.

In some examples wherein the OPA comprises a unipolar power supply, the conditioning stage may comprise a shifting branch adapted to add an offset voltage to a voltage Vin across the specific component. The offset voltage is determined such that an output voltage Vout of the OPA is positive when a FD of a specific switch associated to the specific component 130 is "on". Indeed, a FD voltage Vf across a FD, when such FD is "on", is negative and therefore, an OPA supplied by unipolar power supply will clamp a negative voltage to 0V and will therefore lost information regarding the FD voltage Vf across the FD.

In some examples and as illustrated in FIGS. 4a and 4b, the shifting branch comprises a shifting power source Vopa providing a power supply and a shifting resistance Ropa connected to a positive input of the OPA. The shifting power source Vopa, the shifting resistance Ropa and the input resistance Rin may be determined such that the output of the OPA is positive when a FD of a specific switch associated to the specific component 130 is "on". A transfer function of the OPA may therefore be determined based on the input resistance IR, the shifting resistance Ropa, the shifting power source Vopa and on the voltage Vin across the specific component 130s. The transfer function of the OPA corresponds in the present disclosure to a function giving the output voltage Vout of the OPA based on the input voltage Vin across the specific component.

In an illustrative embodiment, the input resistance IR and the shifting resistance Ropa correspond to the same value while the power source Vopa delivers 4V to the OPA. In such examples, a transfer function of the OPA corresponds to the following:

$$Vout = \frac{Vin}{2} + 2V$$

In some alternative examples and as illustrated in FIG. 4c, the OPA comprises a bipolar power supply. In such examples, the shifting branch can be removed since the information of the negative voltage across the FD is comprised in the negative power supply of the OPA. Hence, in the illustrated example of FIG. 4b, a transfer function of the OPA corresponds to the following:

Vout=Vin

The variable speed drive 1 comprises a hardware threshold detector unit 8. The hardware threshold detector unit 8 comprises electric or electronic components adapted to compare a voltage Vin across the specific component 130s to a predetermined voltage threshold. An output of the hardware threshold detector unit 8 corresponds to a logical edge LE.

The hardware threshold detector unit 8 comprises a specific comparator sComp which is connected to the output voltage Vout of the OPA on one side and to a specific synchronous flip-flop sFF of a flip-flop unit 9 on another side.

The specific comparator sComp is adapted to compare an output voltage Vout of the OPA to a comparator voltage threshold Vth and transmit a logical edge LE to the specific synchronous flip-flop sFF based on such comparison. The logical edge LE transmitted to the specific synchronous flip-flop sFF corresponds to a voltage signal indicating whether the voltage Vin across the specific component 130s is greater than the predetermined voltage threshold.

It should be noted that since the output voltage Vout of the OPA is obtained from the voltage Vin across the specific component 130s, such voltage Vin across the specific component can be compared to a predetermined threshold using such output voltage Vout.

In some examples, the output voltage Vout of the OPA is compared, by the specific comparator sComp, to a comparator voltage threshold Vth. The comparator voltage threshold Vth is determined based on the transfer function of the OPA and on a predetermined voltage threshold associated to the specific component 130s. Indeed, the predetermined voltage threshold corresponds to the voltage to be compared to the voltage Vin across the specific component 130s. However, such voltage Vin may not be available at the output of the OPA (due to the transfer function of the OPA) and therefore, the comparator voltage threshold Vth to be compared to the output voltage Vout of the OPA should consider this transfer function to effectively compare the voltage Vin across the specific component 130s to the predetermined voltage.

In some examples, the specific comparator sComp comprises an OPA acting as a comparator. Such examples are illustrated in FIGS. 4a, 4b and 4c. In such examples, the output voltage Vout of the OPA may be applied on a first input of the OPA while a comparator voltage threshold Vth may be applied on a second input of the OPA.

The comparator voltage threshold Vth may therefore be implemented based on a reference power source Vref associated to the specific comparator sComp. In some examples, a comparator voltage threshold Vth may be implemented based on a voltage divider, for example based on a resistive bridge voltage divider, as illustrated in the FIGS. 4a, 4b and 4c.

In some examples wherein the conditioning stage 7 comprises the shifting branch, a comparator voltage threshold Vth may be implemented based on a reference power source Vref which corresponds to the same power source that the shifting power source Vopa. This allows reducing an impact of a potential voltage deviation of the shifting power source Vopa on the comparison.

In some examples wherein the OPA of the conditioning stage 7 is supplied by a positive unipolar power source, the OPA of the hardware threshold detector unit 8 acting as a comparator may be supplied by a positive unipolar power source, for example the same positive unipolar power source than the one supplying the OPA of the conditioning stage 7.

It should be noted that a comparator voltage threshold Vth may be associated to a comparator linked to a dedicated component of the specific switch. Indeed, as illustrated in FIGS. 4b and 4c, the hardware threshold detector unit 8 may comprise two comparators, a FD comparator fdComp and an IGBT comparator igbtComp respectively associated to the FD component and to the IGBT component of the specific switch. A predetermined voltage threshold associated to a FD component may not be the same than the one associated to an IGBT component. Hence, a voltage threshold Vth associated to the FD comparator fdComp and a voltage threshold Vth associated to the IGBT comparator ibgtComp may be different.

In the illustrated examples, a voltage threshold associated to a FD component is noted Vfth (or −Vfth depending on the polarization of the circuit) while a voltage threshold associated to an IGBT component is noted Vceth.

In some examples wherein the hardware threshold detector unit 8 comprises an IGBT comparator and wherein the OPA of the conditioning stage 7 is supplied by a positive unipolar power source, the IGBT comparator may be unipolar power supplied. Such examples allow obtaining a positive voltage (i.e. a positive saturation voltage) in output of the IGBT comparator, when IGBT component is "on", and when the output voltage Vout of the OPA is greater than the voltage threshold Vceth associated to the IGBT comparator.

In some examples wherein the hardware threshold detector unit comprises a FD comparator, wherein the OPA of the conditioning stage is supplied by a positive unipolar power, and wherein the conditioning stage also comprises the shifting branch, the FD comparator may be unipolar power supplied. Such examples allow obtaining a positive voltage (i.e. a positive saturation voltage) in output of the FD comparator, when FD component is "on", and when the output voltage Vout of the OPA is greater than the voltage threshold Vfth associated to the IGBT comparator.

In some examples wherein the hardware threshold detector unit comprises a FD comparator and wherein the OPA of the conditioning stage is supplied by a bipolar power, the FD comparator may also be supplied by bipolar power. In such examples, the FD voltage threshold may be a negative voltage threshold −Vfth applied on a positive input of the FD comparator as illustrated in FIG. 4c. Such examples allow obtaining a positive voltage (i.e. a positive saturation voltage) in output of the FD comparator, when FD component is "on", and when the voltage threshold −Vfth associated to the FD comparator is greater than the output voltage Vout of the OPA.

As said above, the specific comparator sComp is adapted to transmit a logical edge LE to a specific synchronous flip-flop sFF. A synchronous flip-flop FF should be understood in the present disclosure as a flip-flop whereby a logical edge received in input of the flip-flop generates a high logic level in the output of the flip-flop during a predetermined logic level of a synchronous signal. The high logic level may be maintained in output of the flip-flop as long as the logic level of the synchronous signal is at the predetermined logic level, whatever the input received by the flip-flop. The output of the flip-flop may be reset (i.e. set in a low logic level) when the logic level of the synchronous signal is modified.

In some examples, a synchronous flip-flop FF corresponds to a D flip-flop.

The synchronous flip-flop FF is comprised in a flip-flop unit 9. The flip-flop unit 9 is adapted to receive, as input, a logical edge LE from the hardware threshold detector unit 8 and to transmit, as output, a high logic level LS to an interrupt port of the interrupt controller IPROC depending on an interrupt enable signal IES. The interrupt enable signal IES corresponds to the synchronous signal driving the specific synchronous flip-flop sFF.

Hence, when the voltage across the specific component crosses the predetermined voltage threshold, a rising edge may be transmitted from the specific comparator sComp to the specific synchronous flip-flop Sff. An high logic level LS may then be transmitted to the interrupt port of the interrupt controller IPROC if the rising edge is received by the specific flip-flop sFF when the interrupt enable signal IES driving the specific synchronous flip-flop sFF is in the predetermined logic level. In some examples, a predetermined logic level corresponds to a high logic level.

Transmitting a high logic level LS to an interrupt port of the interrupt controller IPROC of the interrupt protocol can trigger an interrupt protocol. The interrupt controller IPROC may correspond to the PWM controller or to another controller adapted to implement interrupt protocols or interrupt routines. In some examples, the interrupt controller corresponds to a microcontroller.

Hence, an interrupt protocol of an interrupt port of the interrupt controller IPROC may be triggered when a voltage across a specific component crosses a predetermined threshold depending on a logic level of the interrupt enable signal IES. Such interrupt protocol triggered using electronic and electrical components is therefore almost instantaneous, for example smaller than 1 μs.

In examples wherein the hardware threshold detector unit comprises the FD comparator fdComp and the IGBT comparator igbtComp, the flip-flop unit 9 may comprise two synchronous flip-flops FF. The hardware threshold detector unit 8 may comprise a FD flip-flop fdFF connected to the FD comparator fdComp and associated to the FD and an IGBT flip-flop igbtFF connected to the IGBT comparator igbtComp and associated to the IGBT.

In such examples, the flip-flop unit 9 may comprise an OR logic gate connected on one side to the FD and IGBT flip-flops and on another side to the interrupt port of the interrupt controller. In other words, both components (FD or IGBT) of a same switch may trigger a same interrupt protocol. Such examples are illustrated in FIGS. 4b and 4c wherein a logical edge transmitted by the IGBT comparator igbtComp to the IGBT flip-flop igbtFF correspond to a LEigbt edge while a logical edge transmitted by the FD comparator fdComp to the FD flip-flop fdFF correspond to a LEfd edge.

Both FD flip-flop and IGBT flip-flop are driven by a different interrupt enable signal IES such that when their respective interrupt enable signal IES corresponds to a predetermined logic level, their respective high logic level in output of their respective flip-flop can be transmitted to the interrupt port of the interrupt controller IPROC. In particular, in the FIGS. 4b and 4c, the interrupt enable signal IES driving the FD flip-flop is noted IESfd while the interrupt enable signal IES driving the IGBT flip-flop is noted IESigbt.

The interrupt enable signal IES is provided for a specific flip-flop sFF by an interrupt enable unit 10. A logic level of such interrupt enable signal IES, for a specific flip-flop sFF, is determined based on commutation information of switches.

In particular, commutations of switches induce voltage perturbations across components of the switches and in particular across the specific component. By commutation of a switch, it is designated here the commutation of the IGBT component associated to such switch. Indeed, when the specific switch associated to the specific component commutes, the voltage across the specific component gradually increases (following a capacitor load) before reaching a more stable value. Regarding the other switches, when such other switches commute, they may induce voltage spikes on the voltage across the specific component due to parasite coupling. Therefore, the voltage perturbations may lead a voltage Vin across a specific component to cross its associated predetermined voltage threshold and thereby may lead to trigger an undesirable interrupt protocol. To provide an accurate detection of a crossing of a predetermined voltage threshold for a specific component, the interrupt enable signal may enable a specific flip-flop to transmit an high logic level at reception of a logical edge received from a specific comparator during a period of time whereby the voltage perturbation across such specific component should be negligible and whereby the voltage across the specific component should tend to the stabilization.

Hence, a logic level of the interrupt enable signal IES allowing a specific flip-flop sFF to transmit a high logic level at reception of the logical edge to the interrupt port of the interrupt controller can be transmitted during a period of time whereby the voltage across such specific component should be stable.

It should be noted that the logical edge is therefore transmitted rapidly from the specific comparator sComp to the specific synchronous flip-flop sFF when the voltage across specific component crosses the predetermined voltage threshold. Similarly, the high logic level LS is therefore transmitted rapidly from the specific synchronous flip-flop sFF to the interrupt port of the interrupt controller IPROC at reception of the logical edge when the interrupt enable signal IES is in the predetermined logic level. In other words, when a voltage across a specific component crosses its associated predetermined voltage threshold during a period of time whereby the IES is in the predetermined logic level, the detection of such crossing by the interrupt controller IPROC is nearly instantaneous, for example is lower than 1 μs.

In some examples, a logic level of the interrupt enable signal IES allowing a flip-flop to transmit a high logic level LS to an interrupt port of an interrupt controller may correspond to a high logic level. In other words, in such examples, a synchronous flip-flop is adapted to transmit a high logic level LS to an interrupt port of an interrupt controller during a high logic level of the interrupt enable signal IES.

In some examples, commutation information of switches determining a logic level of an interrupt enable signal IES intended for a specific flip-flop comprises a component passing state of a specific component (corresponding to the specific component associated to the specific flip-flop) and periods of time following commutations of IGBT components.

In some examples, a high logic level of the interrupt signal IES for a specific flip-flop sFF associated to a specific component may be determined when:

a component passing state of the specific component is "on".

a period of time following a commutation of the specific switch is greater than a specific switch delay, and a period of time following a commutation of switches is greater than a switch delay.

A condition whereby the component passing state of the specific component is "on" allows avoiding triggering an interrupt protocol when such component is "off". Such condition is illustrated by an ON box of the interrupt enable unit 10.

A condition whereby the period of time following a commutation of switches should be greater than a switch delay allows waiting a switch delay to reduce the voltage perturbation induced by a commutation of the switches on the voltage Vin across the specific component.

A condition whereby a period of time following a commutation of the specific switch allows waiting a specific switch delay on which the voltage Vin across the specific component gradually increases to reach a more stable value.

In some examples, the interrupt enable unit 10 comprises timers associated to switches. Such timers may be configured for counting a switch delay or a specific switch delay. It should be noted that a timer counting a delay may up-count or down-count such delay.

In some examples, a specific switch is associated to a specific switch timer ssT and to another switch timer sT.

The specific switch timer ssT may be adapted to start counting time at a first switching of the specific switch and may be adapted to reset the counting at a second switching of the specific switch directly following the first switching of the specific switch. The specific switch timer ssT may therefore be adapted for counting the specific switch delay.

The other switch timer sT may be adapted to start counting time at a first switching of any switches and is adapted to reset the counting at a second switching of any switches directly following the first switching of any switches. The other switch timer sT may therefore be adapted for counting the switch delay.

In such examples and as illustrated in FIGS. 4a, 4b and 4c the interrupt enable unit 10 may comprise an AND logic gate connected on one side to the specific switch timer ssT and to the other switch timer sT of a specific switch and on another side to the specific flip-flop sFF. A difference between an interrupt enable signal IES of a first component of a specific switch and a second component of the specific switch may therefore reside in the component passing state (on or off) of the components. In some examples and as illustrated in the figures, the AND gate may also be connected to a component passing state of a specific switch (box ON).

In some examples, the timers are driven by the PWM controller, for example its processor PROC as illustrated by the FIGS. 4a, 4b and 4c, such that commutation information related to the switches are already contained by such PWM controller. This allows avoiding sending such commutation information to another controller and also allows implementing the interrupt enable unit 10 in the PWM controller.

In some examples, each leg of the variable speed drive comprises a respective conditioning stage, a respective hardware threshold detector unit and a respective flip-flop unit. Such examples allow detecting when a voltage across a component of a switch of each leg crosses an associated predetermined voltage threshold.

In some examples, each respective flip-flop unit associated to a respective leg may be adapted to transmit a respective high logic level LS to a respective specific interrupt port of the interrupt controller IPROC, at reception of a logical edge LE received from its respective hardware threshold detector unit. Such examples allow implementing a different interrupt protocol for each leg of the variable speed drive.

In some examples, the variable speed drive comprises a respective conditioning stage, a respective threshold detector unit and a respective flip-flop unit for each switch. Such examples allow detecting when a voltage across a component of each switch crosses an associated predetermined voltage threshold.

In some examples, the variable speed drive comprises a respective comparator and a respective flip-flop for each component of each switch. In such examples, the variable speed drive comprises a respective interrupt enable signal for each respective flip-flop.

In some examples, the interrupt enable unit 10 may be shared at least in part between the different flip-flops.

In some examples, each switch may be associated with a respective specific switch timer and with a respective other switch timer for counting a respective specific switch delay and a respective switch delay.

At this stage, we understand that a combination of the conditioning stage 7, the hardware threshold detector 8, the flip-flop unit 9 and the interrupt controller IPROC allows a variable speed drive to detect and trigger an interrupt protocol when a voltage across a specific component (FD or IGBT components) of a specific switch of such variable speed drive crosses a predetermined voltage threshold (which can be different depending on the targeted component and on the targeted switch).

Such detection is technically complex since voltage across components of switches of the drive alternates between low and high voltage depending on a passing state of the components and considering that variable speed drives driving an electric motor generally involves high currents (several tens of Ampere) and high voltage (several hundreds of Volt). Hence, the detection should be accurate while protecting the different elements implementing such detection against electrical damages induced by high voltage and high current.

To provide an accurate detection of the crossing of such predetermined threshold for triggering an interrupt protocol, the variable speed drive also comprises the interrupt enable unit 10 which allows reducing voltage perturbations and fluctuations induced by commutation of the switches on the voltage Vin across the specific component.

In particular, the detection of the crossing of a predetermined voltage across a specific component triggering an interrupt protocol may allow determining a dedicated parameter associated to such specific component and to such predetermined threshold, for example to monitoring a state of the specific component. However, it should be noted that monitoring a state of the specific component based on the detection of the voltage crossing the predetermined threshold corresponds to an example of application that could be implemented based on a variable speed drive comprising examples of circuit described in reference to FIGS. 3, 4a, 4b and 4c. Such example of application is not a limitative example and the capacity of the variable speed drive to trigger an interrupt protocol in real time when a voltage across a specific component of one of its switches crosses a predetermined threshold may be used for other applications.

Figure 5:
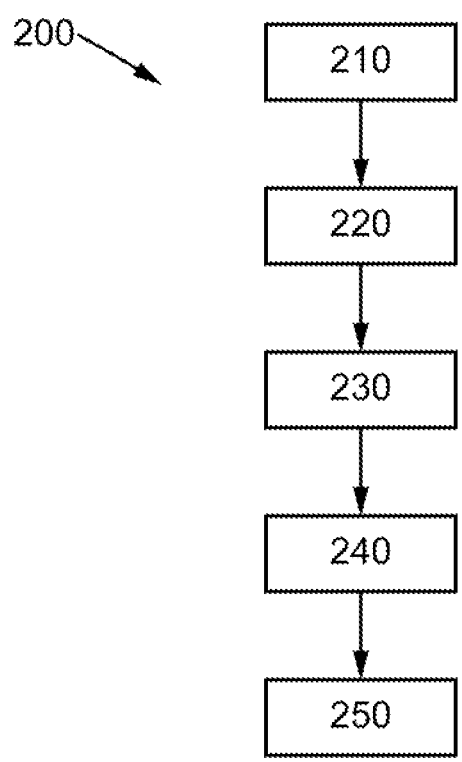
FIG. 5 illustrates an example of a method for monitoring a state of a component of a switch of a variable speed drive.

In reference to FIG. 5 is presented below an example method 200 for monitoring a state of a component of a switch of a variable speed drive. The example method is implemented based on an example of variable speed drive according to the present disclosure. Hence, the elements implemented in the example method 200 are equivalents to the elements having the same designation presented above.

It should be noted that the example method 200 is presented for a single component of a switch but a plurality of components of the switches or each component of the switches can be monitored in parallel by an equivalent method using examples of circuit presented above. The example method may therefore be controlled by at least one controller, for example by the interrupt controller IPROC or by another controller.

As illustrated by the bloc 210, the method 200 comprises delivering 210, by the interrupt enable unit 10, the interrupt enable signal IES. The logic level of the interrupt enable signal IES may be determined based on commutation information of switches. Examples of commutation information have been defined above. In case of multiple components monitored, the interrupt enable signal IES differs depending on the component as explained above.

As illustrated by the bloc 220, the method 200 comprises monitoring, by the specific comparator sComp, a voltage Vin across the specific component of the specific switch 130s of a specific leg. In some examples, monitoring a voltage Vin across the specific component corresponds to monitor, by the interrupt controller IPROC, a high logic level LS on an interrupt port associated to the specific leg.

As illustrated by the bloc 230, when the voltage across the specific component of the specific switch 130s crosses a predetermined voltage threshold associated to the specific component while the interrupt enable signal IES is at a predetermined logic level, the method 200 comprises measuring a current in a phase of the electric motor 2 associated to the specific leg.

In some examples, the voltage across the specific component of the specific switch 130s crossing the predetermined voltage threshold is detected by a high logic level LS on the interrupt port of the interrupt controller IPROC associated to the specific leg.

In some examples, measuring a current in a phase of the electric motor 2 associated to the specific leg is implemented during an interrupt protocol associated to the interrupt port of the interrupt controller IPROC. In some examples, measuring a current is implemented by current measuring means 4.

In some examples, a predetermined logic level of the interrupt enable signal IES corresponds to a high logic level.

As illustrated by the bloc 240, the method comprises determining, based on the current measured, on a junction temperature of the specific component, and on the predetermined voltage threshold associated to the specific component, a state of the specific component.

Determination of the Junction Temperature of the Specific Component:

In some examples, a junction temperature of the specific component is determined based on the temperature measuring means 5, for example by measuring a temperature of the specific component and an ambient temperature. In some examples, the junction temperature is determined during the interrupt protocol of the interrupt controller IPROC.

Determination of a State of the Specific Component Based on a Compared Current and on a Reference Current:

In some examples, determining a state of the specific component based on the current measured, on a junction temperature and on the predetermined voltage threshold may comprise comparing a compared current to a reference current. The reference current is comprised in a reference table associated to the specific component. The reference table may for example be stored in a memory associated to the interrupt controller IPROC.

Determination of the Compared Current:

The compared current is determined based on the current measured during the bloc 230.

In some examples, the compared current may correspond to an absolute value of the current measured during the bloc 230.

In some other examples, an absolute value of the current measured during the bloc 230 may be stored in a specific comparison table along with the predetermined voltage threshold. The specific comparison table is associated to the specific component. In such examples, the compared current may correspond to an average measured current determined as an average of the measured currents associated to a same predetermined voltage threshold of the comparison table. In some examples, the comparison table is implemented as a First In, First Out method (FIFO method).

In some examples, the determined junction temperature is also stored with the measured current and the predetermined voltage threshold in the comparison table.

In some examples, the current measured during the bloc 230 is discarded when the interrupt enable signal IES associated to the specific component is in low level at the end of an acquisition of the measured current. That is, such measured current cannot be used in the determination of the compared current. Indeed, acquisition of the current by the current measuring means is not instantaneous and therefore, a commutation may appear during such conversion and may corrupt the current measured. In particular, an acquisition time of the current by the current measuring means may correspond to several ms using a slope architecture of analog to digital converter, ADC, or may correspond to several tens of μs using a successive approximation ADC. In some examples, the interrupt enable signal IES associated to the specific component may be detected in low level by the interrupt controller IPROC when the output of the specific flip-flop sFF is in low level.

Determination of the Reference Current Based on the Reference Table:

In some examples, the reference table associates a reference current to a reference voltage threshold and to a reference junction temperature. The values of the reference table may for example be determined based on end-of-line measurements of current and temperature of the specific component at one or more reference voltage threshold.

In some examples, the reference current of the reference table to be compared corresponds to the reference current associated to the closest reference voltage threshold compared to the predetermined voltage threshold.

In some alternative examples, a linear interpolation can be applied based on values of the reference table to determine a reference current to be compared. In such example, a reference current to be compared may correspond to a reference current associated to a reference voltage threshold obtained by linear interpolation wherein the reference voltage threshold corresponds to the predetermined voltage threshold.

In some examples, the memory comprises two reference tables. A first reference table corresponds to a FD reference table and is associated to a FD component. A second reference table corresponds to an IBGT reference table and is associated to an IGBT component. In such examples, the reference table comprising the reference current to be compared corresponds to the reference table associated to the specific component involved in the method. In examples monitoring several components in parallel, each monitored component may be associated to a specific reference table or each component of a same type (IGBT or FD) may be associated to a same reference table. A reference table associated to a specific component may for example be determined based on end-of-line measurements of the specific component or based on end-of-line measurements of a component of the same type at one or more reference voltage threshold.

To determine the specific component of a specific switch involved in the method, the example method may use a sign of the current measured. In some examples, the specific component corresponds to a FD when the current measured is negative while the specific component corresponds to an IGBT when the current measured is positive. Hence, the reference current to be compared is chosen on a FD reference table when the current measured during the bloc 230 is negative. By contrast, the reference current to be compared is chosen on an IGBT reference table when the current measured during the bloc 230 is positive. Hence, a sign of the current measured may therefore allow determining the adequate reference table.

In examples monitoring several components in parallel, each switch associated to a monitored component may be associated to a dedicated interrupt port such that triggering an interrupt protocol of a specific interrupt port leads to determine which switch has triggered such interrupt protocol while a sign of the current measured leads to determine which component of the switch is monitored.

State of the Specific Component:

In some examples, a state of the specific component may correspond to a failure state or to a working state. In some examples, a failure state of the specific component may correspond to a wire bonding lift-off state or to a solder delamination state.

In some examples, when an absolute value of a difference between the compared current and the reference current is greater than a failure threshold, a state of the specific component is determined as a failure state. By contrast, when an absolute value of a difference between the compared current and the reference current is lower than the failure threshold, a state of the specific component is determined as a working state. A failure threshold may for example be greater than 2% and may for example be comprised between 3 and 7% of the reference current.

Identification of Wire Bonding Lift-Off for an IGBT.
In some examples wherein:
the specific component is an IGBT component;
the predetermined voltage threshold is lower than the IGBT voltage crossover point CPigbt; and
a difference between the reference current and the compared current is greater than the failure threshold;
the example method may comprise determining a wire-bonding lift-off state associated to the specific component.
In some examples wherein:
the specific component is an IGBT component;
the predetermined voltage threshold is greater than the IGBT voltage crossover point CPigbt;
a difference between the reference current and the compared current is greater than the failure threshold; and
the determined junction temperature is lower than a working temperature threshold; the example method may comprise determining a wire-bonding lift-off state associated to the specific component.

Identification of Solder Delamination for an IGBT:
In some examples wherein:
the specific component is an IGBT component;
the predetermined voltage threshold is lower than the IGBT voltage crossover point CPigbt; and
a difference between the compared current and the reference current is greater than the failure threshold associated to the predetermined voltage threshold;
the example method may comprise determining a solder delamination state associated to the specific component.
In some examples wherein:
the specific component is an IGBT component;
the predetermined voltage threshold is greater than the IGBT voltage crossover point CPigbt;
a difference between the reference current and the compared current is greater than the failure threshold; and
the determined junction temperature is greater than a working temperature threshold associated to the predetermined voltage threshold;
the example method may comprise determining a solder delamination state associated to the specific component.

Identification of Wire Bonding Lift-Off for a FD:
In some examples wherein:
the specific component is a FD component;
the predetermined voltage threshold is lower than the FD voltage crossover point; and
a difference between the reference current and the compared current is greater than the failure threshold;
the example method may comprise determining a wire-bonding lift-off state associated to the specific component.
In some examples wherein:
the specific component is a FD component;
the predetermined voltage threshold is greater than the FD voltage crossover point;
a difference between the reference current and the compared current is greater than the failure threshold; and
the determined junction temperature is lower than a working temperature threshold associated to the predetermined voltage threshold;
the example method may comprise determining a wire-bonding lift-off state associated to the specific component.

Identification of Solder Delamination for a FD:
In some examples wherein:
the specific component is a FD component;
the predetermined voltage threshold is lower than the FD voltage crossover point; and
a difference between the compared current and the reference current is greater than the failure threshold;
the example method may comprise determining a solder delamination state associated to the specific component.
In some examples wherein:
the specific component is a FD component;
the predetermined voltage threshold is lower than the FD voltage crossover point;
a difference between the reference current and the compared current is greater than the failure threshold; and
the determined junction temperature is greater than a working temperature threshold associated to the predetermined voltage threshold;
the example method may comprise determining a solder delamination state associated to the specific component.

In some examples, the working temperature threshold is obtained based on an original junction temperature of the specific component when the voltage across the specific component crosses the predetermined voltage threshold. The original junction temperature corresponds to a junction temperature of the specific component in end-of-line when the voltage across the specific component crosses the predetermined voltage threshold.

The working temperature threshold allows discriminating which of the solder delamination or the wire bonding lift-off affects the current when a sense of deviation of such current alone does not allow such discrimination. Indeed, we have seen above in reference to FIGS. 2a and 2b that both wire bonding lift-off and solder delamination affect the current in a same direction (i.e. by reducing a current flowing through the specific component compared to the specific component in end-of-line) when a voltage Vin across a specific component is greater than the crossing point of such specific component. However, wire bonding lift-off does not affect the junction temperature of the specific component while solder delimitation does. Therefore, by determining a working temperature threshold based on an original junction temperature of the specific component, the example method has access to a starting value of the junction temperature of the specific component at a predetermined voltage threshold before a potential solder delamination. Then, by comparing the determined junction temperature to such working temperature threshold, the example method is able to determine whether the junction temperature has significantly changed or not and therefore determine which of the solder delamination or the wire bonding lift-off affects the current by reducing its flow.

As illustrated in bloc 250, the example method comprises triggering an alert. The alert may be triggered by the alert unit 6.

In some examples, the alert is triggered when a state of the specific component is determined as a failure state. The alert may therefore be triggered when a state of the specific component is determined as a wire bonding lift-off state or as a solder delamination state.

In some examples, an alert comprises at least one of sending an alert message, playing an alert song, and displaying an alert icon. Sending an alert message may, for example, allow warning operators, manufacturers or interested persons of the determination of a default on a specific component. Hence, for a manufacturer, such warning may for example be used to create statistics, for example lifetime statistics associated to the components of the switch. Playing an alert song and displaying an alert icon may allow, for example, warning operators located close to the system. In some examples, a VSD may comprise a networking module and an alert may be transmitted through a network to a remote location or server collecting such information from a plurality of VSDs.

Hence, we understand that examples of circuit presented above allowing the variable speed drive to detect a predetermined voltage threshold across a specific component may lead to measure parameters giving information about the specific component, for example to determine a state of such component based on a current flowing through the component.

Indeed, by comparing a reference current associated to a reference voltage threshold corresponding to the predetermined voltage threshold for the specific component, to a compared current determined based on a current measured at such predetermined voltage threshold, the example method is able to detect a deviation between the compared current and the reference current at a dedicated voltage. As explained in reference to FIGS. 2a and 2b, a deviation of the current at the predetermined voltage threshold, depending on the value of such predetermined voltage threshold and on a sense of deviation of the current, allows determining whether a specific component is subjected to wire bonding lift-off or to solder delamination. Indeed, and as said above, determining both junction temperature value and current value associated to the specific component at a predetermined voltage and comparing such values to reference value corresponding to end-of-line values associated to the specific component may allow detecting wire bonding lift-off or solder delamination of the specific component. Both wire bonding lift-off and solder delamination represent the most recurrent issues for FD and IGBT components. The example method and the variable speed drive according to the disclosure therefore allows anticipating wire bonding lift-off or solder delamination of a component of a switch and may, for example, allow replacing such component before switch failure. The example method therefore increases safety of the operators and reduces potential damages on the variable speed drive and on the controlled electric motor. In other words, the presented method, based on a real time detection of a voltage across a component of a switch crossing the predetermined voltage threshold and on current and temperature measurements, allows protecting the system (variable speed drive and electric motor) and the different operators, therefore reducing the cost of maintenance of such system by determining whether the component is subjected to wire bonding lift-off or to solder delamination.

However, it should be noted that the determination of a state of a specific component and in particular the determination of wire bonding lift-off or solder delamination corresponds to an example of application rendered possible by the detection, in real time, of the voltage across the specific crossing a predetermined threshold and by the triggering of an interrupt protocol. Hence, the different circuits presented in reference to FIGS. 3, 4a and 4b could be used to determine, in real time, by triggering an interrupt protocol, other parameters linked to the specific component or to the system in general when the voltage across the component is detected at a predetermined value. Moreover, the examples of circuit described by the present disclosure also considers the different voltage perturbations induced by commutations of the switch to ensure a detection of the voltage crossing the predetermined threshold with reduced voltage perturbations.

The invention claimed is:

1. A variable speed drive for driving a three-phase electric motor, the variable speed drive comprising an inverter, a DC-link adapted to supply the inverter with a significantly continuous voltage, an interrupt controller, a conditioning stage, a hardware threshold detector unit, a flip-flop unit and an interrupt enable unit, wherein:
the inverter comprises three legs connected to the three phases of the electric motor, each leg being connected on one side to a positive bus of the significantly continuous voltage and on another side to a negative bus of said significantly continuous voltage, each leg comprising a top switch and a bottom switch; wherein
each switch comprises two components, a first component being an Insulated Gate Bipolar Transistor, IGBT, controlled by a pulse width modulation, PWM, controller and a second component being a freewheeling diode, FD, connected in parallel with the IGBT;
the conditioning stage comprises an input resistance connected to a collector of a specific switch of the inverter and an operational amplifier, OPA, connected to the input resistance;
wherein the conditioning stage is adapted to clamp an input voltage of the OPA at an OPA power supply voltage;
the hardware threshold detector unit is connected to an output of the OPA of the conditioning stage, the threshold detector unit comprising a specific comparator;

wherein the specific comparator is adapted to compare a voltage across a specific component of the components of the specific switch to a predetermined voltage threshold associated to the specific component, and the specific comparator s adapted to transmit a logical edge to a specific synchronous flip-flop of the flip-flop unit based on the comparison;

wherein the specific synchronous flip-flop is adapted to receive an interrupt enable signal from the interrupt enable unit, and the specific synchronous flip-flop is adapted to transmit a high logic level to an interrupt port of the interrupt controller at reception of the logical edge based on a logic level of the interrupt enable signal; and the logic level of the interrupt enable signal is determined based on commutation information of switches.

2. The variable speed drive according to claim 1, wherein commutation information of switches comprises a component passing state of the specific component and periods of time following commutations of IGBT components.

3. The variable speed drive according to claim 1, wherein the specific synchronous flip-flop is adapted to transmit the high logic level to the interrupt port of the interrupt controller during a high logic level of the interrupt enable signal, and wherein the high logic level of the interrupt enable signal is determined when:
a component passing state of the specific component is "on",
a period of time following a commutation of the specific switch is greater than a specific switch delay, and
a period of time following a commutation of switches is greater than a switch delay.

4. The variable speed drive according to claim 1, wherein the specific component of the specific switch is the IGBT of the specific switch, the specific comparator is an IGBT comparator associated to the IGBT of the specific switch, the specific synchronous flip-flop is an IGBT synchronous flip-flop associated to the IGBT of the specific switch and connected to an output of the IGBT comparator;

wherein the threshold detector unit comprises a FD comparator associated to the FD of the specific switch; and
wherein the flip-flop unit comprises a FD synchronous flip-flop associated to the FD of the specific switch, the FD synchronous flip-flop being connected to an output of the FD comparator and adapted to transmit a high logic level at reception of a logical edge of the FD comparator to the interrupt port of the interrupt controller based on a logic level of a dedicated interrupt enable signal.

5. The variable speed drive according to claim 4, wherein the flip-flop unit comprises an OR logic gate connected on one side to the FD and IGBT flip-flops and on another side to the interrupt port of the interrupt controller.

6. The variable speed drive according to preceding claim 1, wherein each leg of the variable speed drive comprises a respective conditioning stage, a respective hardware threshold detector unit and a respective flip-flop unit and wherein each respective flip-flop unit associated to a respective leg is adapted to transmit a respective high logic level to a respective specific interrupt port of the interrupt controller, at reception of a logical edge received from its respective hardware threshold detector unit.

7. The variable speed drive according to claim 1, wherein the variable speed drive comprises a respective conditioning stage, a respective hardware threshold detector unit and a respective flip-flop unit for each switch.

8. The variable speed drive according to claim 1, wherein the interrupt enable unit comprises timers associated to switches.

9. The variable speed drive according to claim 8, wherein a specific switch is associated to a specific switch timer and to another switch timer, wherein the specific switch timer is adapted to start counting time at a first switching of the specific switch and is adapted to reset the counting at a second switching of the specific switch directly following the first switching of the specific switch, and wherein the other switch timer is adapted to start counting time at a first switching of any switches and is adapted to reset the counting at a second switching of any switches directly following the first switching of any switches.

10. The variable speed drive according to claim 9, wherein the interrupt enable unit comprises an AND logic gate connected on one side to the specific switch timer and to other switch timer of the specific switch and on another side to the specific flipflop.

11. The variable speed drive according to claim 1, further comprising current measuring means adapted to measure currents across phases of the electric motor.

12. The variable speed drive according to claim 11, further comprising an alert unit adapted to trigger an alert based on current measurements measured by the current measuring means.

13. A method for monitoring a state of a component of a switch of a variable speed drive according to claim 1;
the method comprising:
delivering, by the interrupt enable unit, the interrupt enable signal, the logic level of the interrupt enable signal being determined based on commutation information of switches;
monitoring, by the specific comparator, a voltage across the specific component of the specific switch of a specific leg;
when the voltage across the specific component of the specific switch crosses a predetermined voltage threshold associated to the specific component while the interrupt enable signal is at a predetermined logic level, measuring, a current in a phase of the electric motor associated to the specific leg;
determining, based on the current measured, on a junction temperature of the specific component, and on the predetermined voltage threshold associated to the specific component, a state of the specific component; and
triggering an alert.

14. The method according to claim 13, wherein triggering an alert comprises at least one of sending an alert message, playing an alert song, and displaying an alert icon.

15. A non-transitory computer-readable storage medium comprising instructions which, when executed by at least one controller, cause the at least one controller to carry out the method of claim 13.

* * * * *